(12) United States Patent
Kuttenkuler et al.

(10) Patent No.: US 8,767,369 B2
(45) Date of Patent: Jul. 1, 2014

(54) METHOD, POWER UNIT, AND POWER SYSTEM HAVING GATE VOLTAGE LIMITING CIRCUIT

(75) Inventors: Jason Daniel Kuttenkuler, Erie, PA (US); Alvaro Jorge Mari Curbelo, Bavaria (DE); Matthias Menzel, Baveria (DE); Jeffrey Wolff, Girard, PA (US); Henry Young, Erie, PA (US); Thomas Zoels, Bavaria (DE)

(73) Assignee: General Electric Company, Schenectady, NY (US)

( * ) Notice: Subject to any disclaimer, the term of this patent is extended or adjusted under 35 U.S.C. 154(b) by 224 days.

(21) Appl. No.: 13/331,682

(22) Filed: Dec. 20, 2011

(65) Prior Publication Data
US 2013/0154711 A1    Jun. 20, 2013

(51) Int. Cl.
*H02H 3/22* (2006.01)
*H02H 3/20* (2006.01)
*H02H 9/04* (2006.01)

(52) U.S. Cl.
USPC .......................................... 361/111; 361/91.1

(58) Field of Classification Search
USPC .................................................. 361/56, 111
See application file for complete search history.

(56) References Cited

U.S. PATENT DOCUMENTS

| | | | |
|---|---|---|---|
| 5,949,273 A | 9/1999 | Mourick et al. | |
| 2002/0024135 A1 | 2/2002 | Arai et al. | |
| 2008/0013231 A1* | 1/2008 | Bazzano et al. | 361/56 |
| 2009/0296291 A1* | 12/2009 | Volke | 361/56 |
| 2010/0059028 A1 | 3/2010 | Ueno | |
| 2011/0279934 A1* | 11/2011 | Guitton et al. | 361/56 |

FOREIGN PATENT DOCUMENTS

JP    6395728 A    4/1988

OTHER PUBLICATIONS

Search Report and Written Opinion from corresponding PCT Application No. PCT/US2012/064916 dated May 10, 2013.
Motto, Eric R., "Hybrid Circuits Simplify IGBT Module Gate Drive", Thirty Fifth International Intelligent Motion Conference, PCIM 1999, Jun. 24, 1999.
Fairchild, "Datasheet IGBT Fairchild HGTP14N36G3VL", Dec. 1, 2001.
Lu, Bin et al., "A Literature Review of IGBT Fault Diagnostic and Protection Methods for Power Inverters", Industry Applications Society Annual Meeting, 2008, IAS '08, IEEE, Piscataway, NJ, USA, pp. 1-8, Oct. 5, 2008.

* cited by examiner

*Primary Examiner* — Dharti Patel
(74) *Attorney, Agent, or Firm* — GE Global Patent Operation; John A. Kramer

(57) ABSTRACT

A power unit (e.g., inverter module) includes a housing and a switch attached to the housing. The switch may be configured to be electrically coupled to a remotely-mounted drive circuit through two or more wire leads. The power unit also includes a clamping circuit electrically coupled to terminals of the switch and in parallel with the switch. The clamping circuit may be disposed inside the housing or on an outer surface of the housing, and is configured to limit a voltage across the switch.

33 Claims, 8 Drawing Sheets

200

US 8,767,369 B2

METHOD, POWER UNIT, AND POWER SYSTEM HAVING GATE VOLTAGE LIMITING CIRCUIT

BACKGROUND

1. Technical Field

Exemplary embodiments of the invention relate generally to electronic devices such as inverters. Other embodiments relate to safety or failsafe circuits for electronic devices.

2. Discussion of Art

Some vehicles may employ electric traction motors for driving wheels of the vehicles. In some of these vehicles, the motors are alternating current (AC) motors whose speed and power are controlled by varying the frequency and the voltage of AC electric power supplied to the field windings of the motors. The electric power may be supplied as DC power that is converted to AC power of controlled frequency and voltage amplitude by a circuit such an inverter. The inverter may include semiconductor switches such as insulated gate bipolar transistors (IGBTs) that are switched on and off by drive circuitry in an alternating fashion to produce an output AC waveform.

The IGBT can be conceptually understood as a bipolar transistor driven by a power MOSFET. It may have an advantage of being a minority carrier device (good performance in on-state, even for high voltage devices), and may have the high input impedance of a MOSFET (it can be driven on or off with a very low amount of power). But, in a low voltage application there may be an undesirable high voltage drop exhibited in the on-state (2 to 4 V). Compared to a MOSFET, the operating frequency of an IGBT is relatively low. This may be because of a so-called 'current-tail' problem during turn-off. This problem may be caused by the slow decay of the conduction current during turn-off. The net result may be that the turn-off switching loss of an IGBT is relatively higher than its turn-on loss. Turn-off energy multiplied by the switching frequency of the intended application may allow for an estimate of the turn-off loss.

It may be desirable to have an electronic device or circuit, such as an inverter, that differs from those devices or circuits that are currently available.

BRIEF DESCRIPTION

In an embodiment of the invention, a power unit includes a housing, a first switch, and first clamping circuit. The first switch may be attached to the housing and is configured to be electrically coupled to a first remotely-mounted drive circuit through two or more first wire leads. The first clamping circuit is electrically coupled to terminals of the first switch and in parallel with the first switch. The first clamping circuit is disposed inside the housing or on an outer surface of the housing and is configured to limit a voltage across the first switch.

In another embodiment, a power system (e.g., for a vehicle) includes an inverter module and a remotely mounted drive circuit. The inverter module is controllable to generate an alternating-current output waveform for driving a motor. The inverter module also includes a clamping circuit and a transistor switch contained within a switch housing. The remotely mounted drive circuit is operatively coupled to the transistor switch through a first wire lead coupling a first terminal of the drive circuit to a gate terminal of the transistor switch and a second wire lead coupling a second terminal of the drive circuit to an emitter terminal of the transistor switch. The clamping circuit is disposed in parallel with the transistor switch between the gate terminal and the emitter terminal for limiting a voltage across the gate and emitter terminals. Further, the clamping circuit is disposed inside the switch housing or on an outer surface of the switch housing.

In another embodiment, a method includes mounting an inverter module to a vehicle, electrically coupling a first terminal of a drive circuit to a gate terminal of the inverter module, and electrically coupling a second terminal of the drive circuit to an emitter terminal of the inverter module. The emitter and gate terminals are electrically connected to a transistor switch of the inverter module. The method also includes mounting the drive circuit to the vehicle remotely from the transistor switch of the inverter module. In the exemplary method, the inverter module includes a clamping circuit disposed on or within a housing of the transistor switch between the gate and emitter terminals for limiting a voltage between the gate and emitter terminals.

Another embodiment relates to a power unit, e.g., the power unit may be an inverter unit or it may include an inverter unit. The power unit includes a transistor switch electrically coupleable to a remotely-mounted drive circuit through two or more first wire leads. The power unit also includes a clamping circuit electrically coupled to first and second terminals of the transistor switch and configured to limit a voltage across the first and second terminals of the transistor switch. The clamping circuit includes a first set of parallel-connected diodes connected to one of the first terminal or the second terminal. The clamping circuit also includes one of: at least one capacitor connected in series with the first set and connected to the other of the first terminal of the second terminal; or a second set of diodes connected in series with the first set and connected to the other of the first terminal or the second terminal.

DRAWINGS

These and other features and aspects of the invention will become better understood when the following detailed description is read with reference to the accompanying drawings in which like characters represent like parts throughout the drawings, wherein.

DETAILED DESCRIPTION

Exemplary embodiments of the invention relate generally to a system and method for improving the reliability of an electronic device such as an inverter. Moreover, such exemplary embodiments may relate to an improved clamping circuit for limiting the gate-emitter voltage across an inverter switch. While mobile and stationary implementations are suitable for use with embodiments of the invention, for ease of example the mobile implementation will be disclosed in detail. And, with regard to the mobile implementation, a particular asset, that is, a diesel-electric locomotive, has been selected for clarity of illustration for the disclosure of particular inventive embodiments. Other suitable vehicles, other than locomotives, are contemplated as suitable mobile assets, to include on-road vehicles, off-highway vehicles, mining equipment, construction equipment, industrial equipment, and marine vessels.

As used herein, a clamping circuit is a circuit in which a diode provides a low resistance whenever the potential at a certain point rises above a certain value in some circuits or falls below a certain value in others, or that maintains at a constant value the positive or the negative extreme of voltage in an alternating-current circuit. As used herein, the term switch may include high-power semiconductor switches, such as insulated gate bipolar transistors (IGBTs), reverse-conducting IGBTs, and bi-mode insulated gate transistors (BIGTs), among others. Other suitable switches may include thyristors and bipolar transistors. Distinctions are noted among the types of switches. For example, there are majority carrier devices (Schottky diode, MOSFET) and minority carrier devices (thyristor, bipolar transistor, IGBT). The majority carrier devices use only one type of charge carriers, while the minority carrier devices use both (i.e., electrons and holes). Included in the distinguishing characteristics is that the majority carrier devices are relatively faster, but the charge injection of minority carrier devices may allow for relatively better on-state performance. As used herein, an inverter is an electrical device that converts direct current (DC) to alternating current (AC); the converted AC can be at a determined voltage and frequency with the use of selected transformers, switches, and control circuits. As used herein, a capacitor is a passive electronic component including a pair of conductors separated by a dielectric (insulator) such that if a potential difference (voltage) across the conductors, a static electric field develops across the dielectric, causing positive charge to collect on one plate and negative charge on the other plate. In this way, the capacitor can store energy in an electrostatic field. Some suitable capacitors may block direct current while allowing alternating current to pass.

Figure 1:
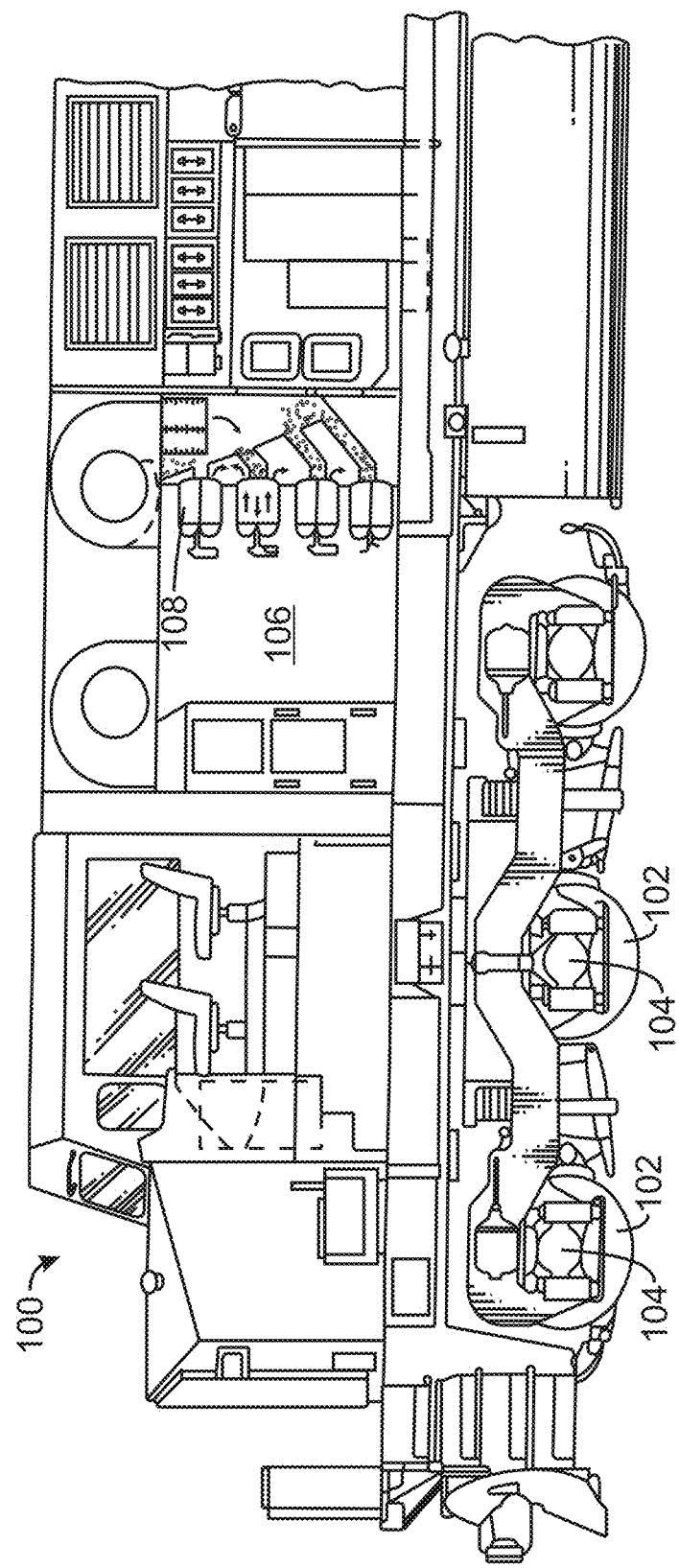
FIG. 1 is a block diagram of a vehicle include systems that illustrate one or more embodiments of the invention.

FIG. 1 is a block diagram of a diesel-electric locomotive illustrating one or more embodiments of the invention. The locomotive, which is shown in a simplified, partial cross-sectional view, is indicated by the reference number 100. A plurality of traction motors, not visible in FIG. 1, are located behind drive wheels 102 and coupled in a driving relationship to axles 104. A plurality of auxiliary motors, not visible in FIG. 1, are located in various locations on the locomotive, and coupled with various auxiliary loads like blowers or radiator fans. The motors may be alternating current (AC) electric motors. As explained in detail below, the locomotive 100 may include a plurality of electrical inverter circuits for controlling electrical power to the motors.

Figure 2:
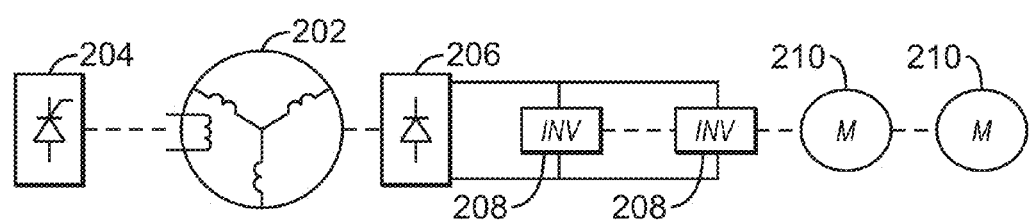
FIG. 2 is a block diagram of a power system in accordance with an embodiment of the invention.

FIG. 2 is a block diagram of a power system in accordance with embodiments. The power system, which is indicated by the reference number 200, may be used to control AC power to a load. The power system 200 may include an alternator 202 driven by an on-board internal combustion engine such as a diesel engine (not shown). The power output of the alternator 202 is regulated by field excitation control indicated by a field control 204. Electrical power from alternator 202 is rectified by a rectifier 206, and coupled to one or more inverters 208. The inverters 208 may use high power semiconductor switches to convert the DC power to AC power with variable frequency and variable voltage amplitude for application to one or more AC motors 210. Although two motors are shown, the locomotive may include four to six AC electric motors, each controlled, for example, by an individual inverter.

Referring again to FIG. 1, electrical power circuits are at least partially located in an equipment compartment 106. The control electronics for the inverters 208 and the field control 204 as well as other electronic components may be disposed on circuit boards held in racks in the equipment compartment 106. Within the equipment compartment 106, the power converters may be mounted to air-cooled heat sinks 108.

The inverters 208 used to generate the AC waveform may include one or more switches. The particular switch to be used may be selected with reference to application specific parameters.

The drive circuitry used to switch the inverter switches on and off may operate remotely from the inverter module. For example, the drive circuitry may be disposed on a remote circuit board, located outside and away from an enclosure of the inverter module, with wire leads used to couple the output of the drive circuit to the gate of the corresponding inverter module switch. The wire leads between the drive circuit and the switch introduce a level of inductance, which can, under certain circumstances, contribute to a voltage build-up across the gate and emitter terminals of the switch. For example, a 10 cm wired connection may introduce well above 100 nH of inductance. To reduce the likelihood of such an occurrence, some inverter modules are configured so that the drive circuit is mounted directly to the inverter module switch and the high-inductance wire leads are eliminated. Such a configuration may impose packaging design constraints on the power system. In accordance with embodiments, the drive circuitry is disposed remotely from the inverter switch with wire leads coupling the drive circuit to the inverter switch, and a clamping circuit is used to mitigate the effect of the high inductance introduced by the wire leads. The clamping circuit, which is of small size compared to the driver and the switch, may be integrated with the switch device to provide a low inductance connection between the clamp and the switch input. Typical clamp to switch inductances are in the few nH range. In this way, the clamp reduces the likelihood that the switch will experience an over-voltage condition while enabling a highly flexible packaging design for the power system.

Figure 3:
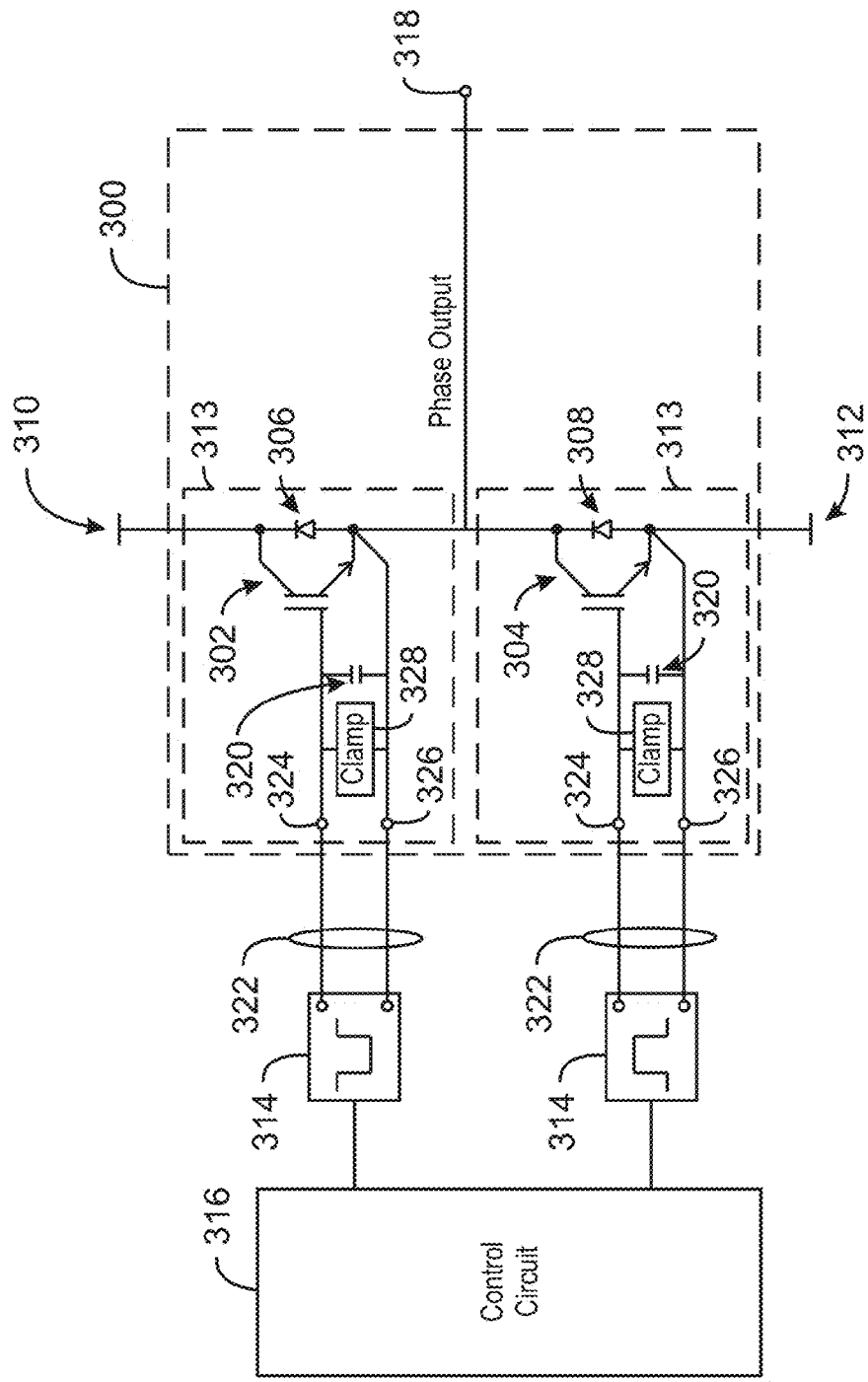
FIG. 3 is a block diagram of an inverter phase leg with clamping circuits in accordance with embodiments of the invention.

FIG. 3 is a block diagram of an inverter phase leg with clamping circuits in accordance with embodiments. As shown in FIG. 3, the inverter phase leg 300 includes a pair of switches 302 and 304. The switches are referred to herein as upper switch 302 and lower switch 304. A first diode, referred to herein as an upper diode 306, is disposed in anti-parallel across the collector and emitter of the upper switch 302. A second diode, referred to herein as a lower diode 308, is disposed in anti-parallel across the collector and emitter of the lower switch 304. The diodes 306 and 308 provide a conductive path for freewheeling current, which is current that is generated, due to the inductance of the circuit and the load, when a current-conducting switch is turned off. The upper diode 306 provides a conductive path for freewheeling current that may result when the lower switch 304 is switched off. The lower diode 308 provides a conductive path for freewheeling current that may result when the upper switch 302 is switched off. The upper switch 302 and lower switch 304 are disposed in series between an upper rail voltage 310 and lower rail voltage 312. In an embodiment, each switch 302 and 304 and its corresponding diode 306 and 308 is disposed within its own separate switch housing 313. In an embodiment, the switches 302 and 304 and the diodes 306 and 308 are disposed within the same housing. For the sake of simplicity, a single inverter phase leg 300 for producing a single-phase output 318 is shown. However, it will be appreciated that an inverter module in accordance with embodiments may include two, three, or more inverter phase legs 300, each providing an output AC waveform for a particular phase. For example, three inverter phase leg 300 may be used to produce a three-phase AC output waveform. Furthermore, embodiments may also include converters such as converters with series connected pairs of legs, three-level and multilevel inverters, H-bridges, and the like.

Each switch 302 and 304 is driven by a drive circuit 314 operatively coupled at least to the gate and emitter of the corresponding switch 302 and 304. A control circuit 316 may be operatively coupled to the drive circuits 314 to coordinate the activation of the switches 302 and 304. The control circuit 316 may cause the switches 302 and 304 to pulse on and off in an alternating fashion to produce an AC waveform at the phase output 318. In embodiments, a gate-emitter capacitor 320 may be disposed in parallel with each switch 302 and 304, in other words, across the gate and emitter of each switch 302 and 304. For purposes of the present description, the term "parallel," when used in regard to three-terminal devices, is used to refer to common connections with any two terminals of the three-terminal device. The gate-emitter capacitor 320 is sized to control the switch timing characteristics of the corresponding switches 302 and 304. In embodiments, the gate-emitter capacitor 320 may be included as a part of the clamp, as shown on FIG. 4. In embodiments, the gate-emitter capacitor 320 may be a separate component, as shown on FIG. 3.

In an embodiment, the drive circuits 314 are disposed remotely from the inverter phase leg 300 and the switches 302 and 304. Describing the drive circuits 314 as being disposed "remotely" means that the drive circuits 314 are not coupled to the switches 302 and 304 through a low-inductance connection (e.g., 10 nH or less) or a very low inductance connection (e.g., 5 nH or less), such as may be accomplished by directly mounting the drive circuits 314 to the switch housings 313. (According to one aspect, more generally, two circuits or other devices are remotely connected if the electrical connection between them is not a low-inductance connection, e.g., if the electrical connection between them is more than 10 nH. According to another aspect, two circuits or other devices are remotely connected if the electrical connection between them is not a very low inductance connection, e.g., if the electrical connection between them is more than 5 nH). The drive circuits 314 may be coupled to the switches 306 and 308 through wire leads 322 disposed between output terminals of the drive circuit 314 and input terminals disposed on each of the switch housings 313. Specifically, one of the wire leads of one pair of wire leads 322 may be coupled to the gate terminal 324 of switch housing 313, and the other wire lead 322 may be coupled to the emitter terminal 326 of the switch housing 313. Although not shown, other functional wires between the driver 314 and the switch housing 313 may be present, for example, a wire lead coupling the driver 314 to a sensing collector terminal of the switch 302. The gate terminal 324 and emitter terminal 326 may be disposed on the outside of the switch housing 313 and may be, for example, screw terminals or other external terminals of the housing ("external" terminal referring to a terminal that is connected to the housing, accessible from outside the housing, and for establishing an electrical connection between an external device and a component internal to the housing). In an embodiment, the wire leads 322 may be disposed in a twisted pair configuration to protect against electromagnetic interference from external sources.

Each drive circuit 314 may be configured to turn on the switch 302 or 304 under its control by providing a positive voltage across the gate and emitter terminals of the switch 302 or 304. For purposes of the present description, the voltage level used to turn the switch 302 or 304 on may be approximately 15 volts. However, it will be appreciated that any suitable voltage level may be used, depending on the design of the switches 302 and 304 used in a particular implementation. Under certain fault conditions, it may be possible for the voltage across the emitter and collector of the switch 302 or 304 to build to an excessive level that could damage the switch. For example, one type of fault condition known as "shoot through" can occur if both switches 302 and 304 are turned on at the same time, creating a short circuit between the upper rail voltage 310 and the lower rail voltage 312 through the two switches 302 and 304. To reduce the likelihood of causing damage to any of the components of the inverter phase leg 300, the drive circuitry 314 may be configured to detect a fault condition and turn off the switch 302 or 304 under its control if a fault condition is detected. However, in the process of turning one of the switches 302 or 304 off, a voltage spike large enough to damage the switch 302 or 304 may develop across the gate and emitter of the switch 302 or 304. The high inductance connection of the wire leads 322 may contribute to such a voltage build-up.

To provide further protection against switch damage in the event of a fault condition, the inverter phase leg 300 includes clamping circuits 328 electrically coupled to the gate and emitter terminals 324 and 326 of each switch housing 313 and in parallel with each corresponding switch 302 and 304. (The inverter module may be provided with one such clamping circuit 328 for each switch 302 and 304.) In embodiments, the clamping circuit 328 is mounted to the outside of the switch housing 313 in proximity to the gate and emitter terminals 324 and 326. In embodiments, the clamping circuit 328 may be disposed within the switch housing 313. The electrical connection between the clamping circuit 328 and the corresponding switch 302 or 304 is a low inductance connection due to its proximity to the switch 302 or 304.

The clamping circuit 328 may be configured to prevent the voltage across the gate and emitter of the switch 302, referred to herein as the "gate-emitter voltage," from exceeding a voltage limit, above which the switch 302 or 304 could be damaged. The voltage limit may be specified by the manufacturer of the particular switch used in a particular implementation. For example, depending on the type and design characteristics of the switch 302 or 304, the voltage limit may be approximately 20 volts. During normal operation, the clamping circuit 328 does not significantly affect the gate-emitter voltage and allows the gate-emitter voltage to reach or exceed the specified turn-on voltage of the switch 302 or 304. The clamping circuit 328 may be configured to reduce the gate-emitter voltage across the switch 302 or 304 when the gate-emitter voltage exceeds a voltage referred to herein as the "clamping threshold voltage." Above the clamping threshold voltage, the clamping circuit may be activated, thus preventing an excessive voltage build-up across the switch 302 or 304. The clamping threshold voltage may be between the turn-on voltage of the switch and the voltage limit specified for the switch 302 or 304. In embodiments, the clamping circuit 328 includes passive components, such as Schottky diodes, Zener diodes, capacitors, and the like. Various clamping circuits are described further in relation to FIGS. 4-6.

Figure 4:
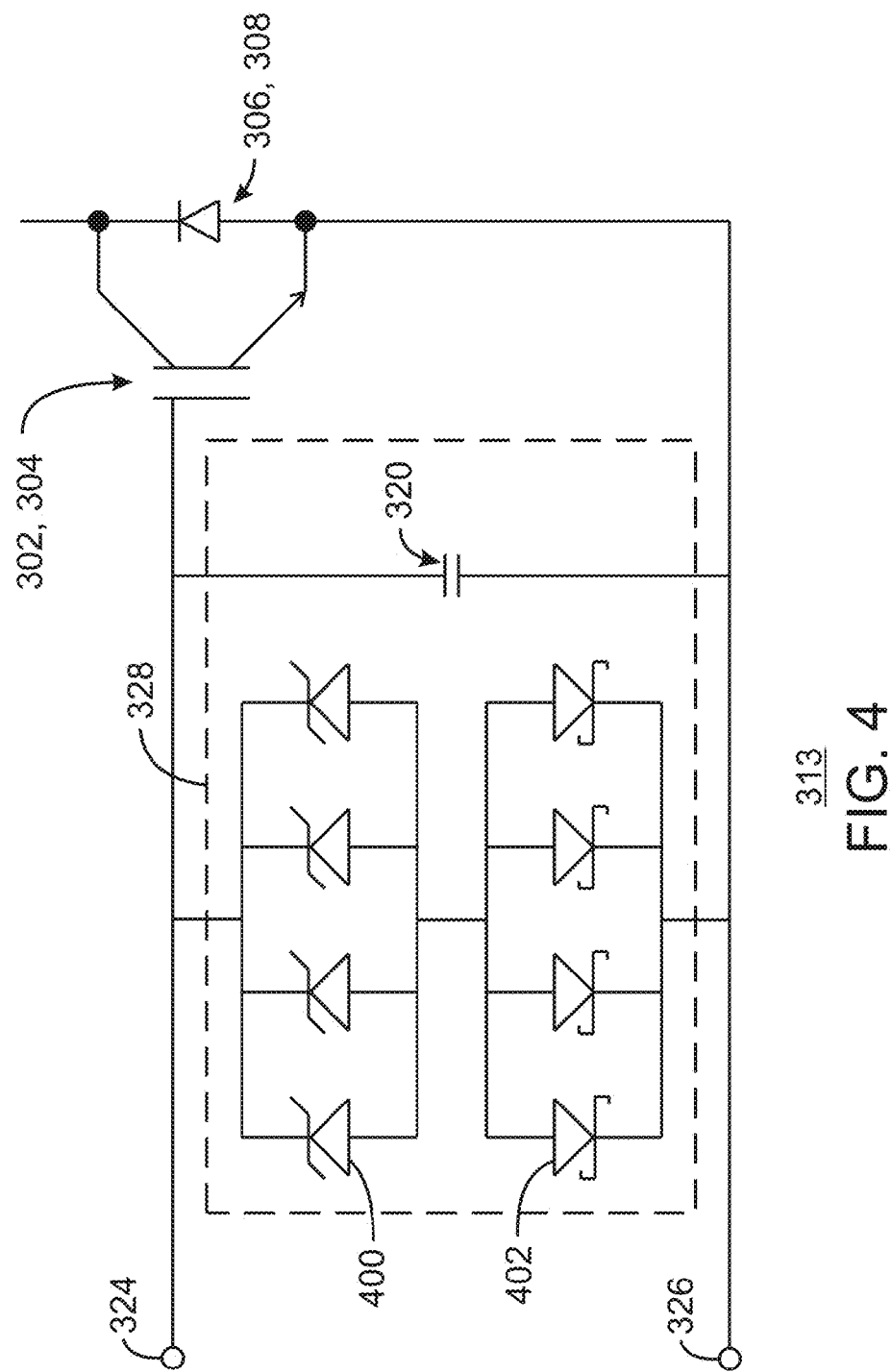
FIG. 4 is a schematic diagram of a clamping circuit in accordance with embodiments of the invention.

FIG. 4 is a schematic diagram of a clamping circuit in accordance with embodiments. As shown in FIG. 4, the clamping circuit 328 may include a set of Zener diodes 400 disposed in series with a set of Schottky diodes 402. As used herein, the term "set" can refer to one or more. The set of Zener diodes 400 may be disposed in parallel with one another. As shown in FIG. 4, the cathode of each Zener diode 400 may be electrically coupled to the gate of the switch and the anode of each Zener diode 400 may be electrically coupled the anode of each of the Schottky diodes 402. The Schottky diodes 402 may also be disposed in parallel with one another. The cathode of each Schottky diode 402 may be electrically coupled to the emitter of the switch and the anode of each Schottky diode 402 may be electrically coupled the anode of each of the Zener diodes 400. A typical Zener diode allows current in the forward direction, from anode to cathode, and also allows current in the reverse direction, from cathode to anode, if the voltage across the Zener diode is larger than the breakdown voltage of the Zener diode. In the embodiment shown in FIG. 4, the clamping threshold voltage will be approximately equal to the breakdown voltage of the Zener diodes 400 plus the forward biasing voltage across the set of Schottky diodes 402. During normal operation of the inverter, the gate-emitter voltage does not exceed the breakdown voltage of the Zener diodes 400, and the Zener diodes 400 present an open circuit between the gate and emitter. Thus, the clamping circuit 328 has little or no effect on the gate-emitter voltage during normal operation. If the gate-emitter voltage exceeds the breakdown voltage of the Zener diodes 400, the Zener diodes 400 allow current in the reverse direction, from gate to the emitter, thereby reducing the voltage level across the gate and emitter of the switch 302 or 304. In this way, the switch is protected in the event of a fault condition. The Schottky diodes 402 block current through the clamping circuit 328 when the switch 306 or 308 is negatively biased, in other words, when the emitter voltage is higher than the gate voltage. In embodiments, other types of diodes may be used instead of the Schottky diodes, such as silicon diodes, germanium diodes, and the like. The selection of diodes may be made with reference to application specific parameters.

Although four Zener diodes 400 and four Schottky diodes 402 are shown, the clamping circuit 328 may include a suitable number of Zener and Schottky diodes. For example, the clamping circuit 328 may include one, two, three, five, or more of each type of diode. Further, the number of Zener diodes 400 may be different from the number of Schottky diodes 402. For example, the clamping circuit may include four Schottky diodes 402 and two Zener diodes 400, three Zener diodes 400 and one Schottky diode 402, or any other suitable combination. When the clamping circuit is active, each of the diodes 400 and 402 presents a small level of resistance that may contribute to a small increase in the gate-emitter voltage. By including four Zener diodes 400 and four Schottky diodes 402 in parallel, the overall resistance of the clamping circuit 328 is reduced, thereby further limiting the gate-emitter voltage when the clamping circuit 328 is active, for example, during a shoot-through fault event or other fast transient event.

Figure 5:
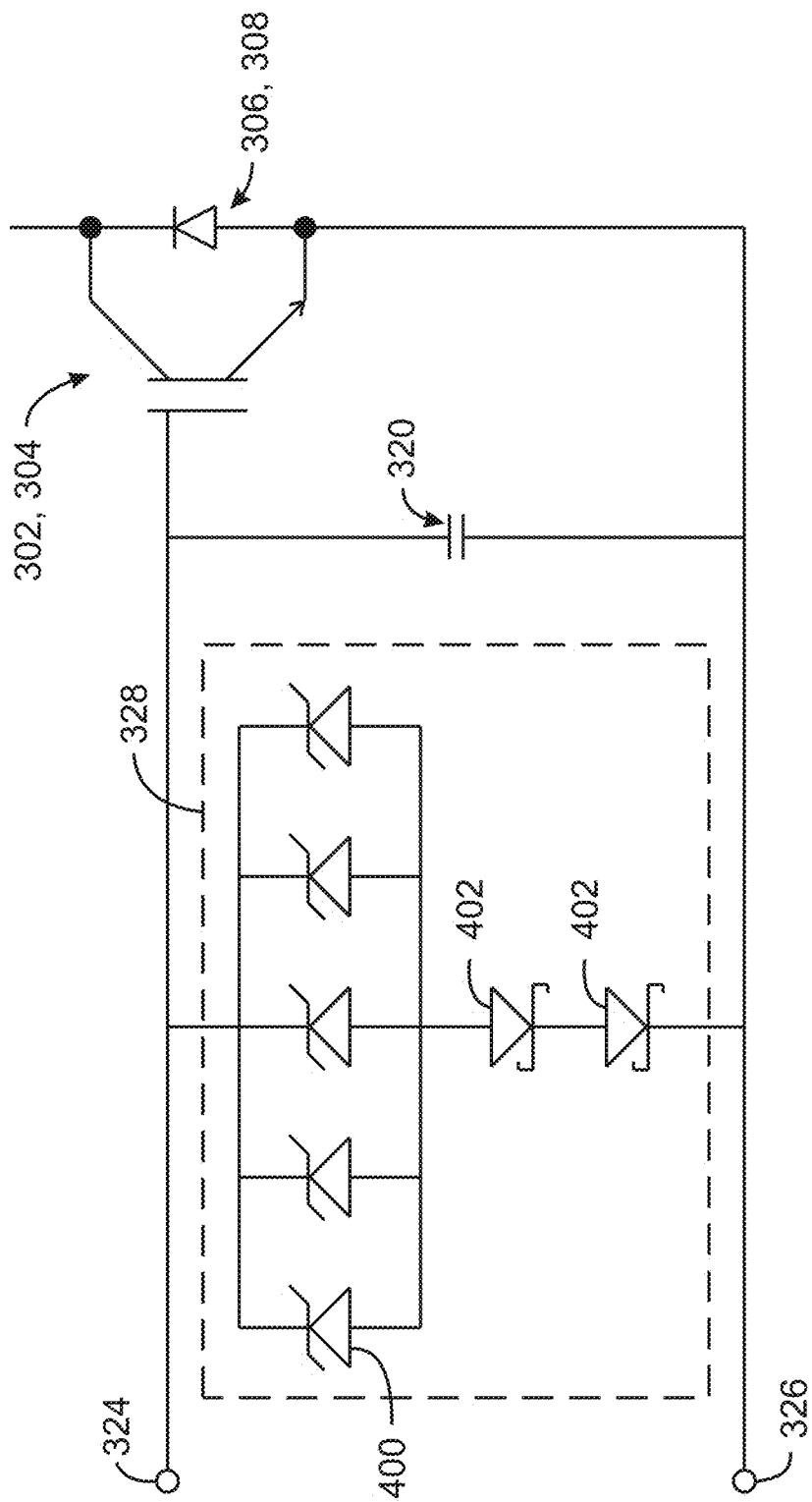
FIG. 5 is a schematic diagram of a clamping circuit in accordance with embodiments of the invention.

FIG. 5 is a schematic diagram of a clamping circuit in accordance with embodiments. As shown in FIG. 5, the clamping circuit 328 may include a set of Zener diodes 400 disposed in series with a set of Schottky diodes 402. Similar to the clamping circuit shown in FIG. 4, the set of Zener diodes 400 may be disposed in parallel with one another, with the cathode of each Zener diode 400 electrically coupled to the gate of the switch. Unlike the clamping circuit of FIG. 4, the anode of each Zener diode 400 is electrically coupled the anode of one of the Schottky diodes 402, and the Schottky diodes 402 may be disposed in series with one another, anode to cathode. The cathode of each Schottky diode 402 may be disposed toward the emitter of the switch 302 or 304 and the anode of each Schottky diode 402 may be disposed toward the anode of each of the Zener diodes 400. In embodiments, the position of the set of Zener diodes 400 and the set of Schottky diodes 402 may be swapped compared to what is shown in FIG. 5.

The clamping circuit of FIG. 5 operates similarly to the clamping circuit of FIG. 4. During normal operation of the inverter, the gate-emitter voltage does not exceed the breakdown voltage of the Zener diodes 400, the Zener diodes 400 present an open circuit between the gate and emitter, and the clamping circuit 328 has little or no effect on the gate-emitter voltage. If the gate-emitter voltage exceeds the breakdown voltage of the Zener diodes 400, the Zener diodes 400 allow current in the reverse direction, from emitter to collector, thereby reducing the voltage level across the gate and emitter of the switch. The Schottky diodes 402 block current through the clamping circuit 328 when the switch 302 or 304 is negatively biased.

Generally, the properties of the diodes 400 and 402, and thus the clamping threshold voltage of the clamping circuit 328, may vary with temperature. For example, the breakdown voltage of the Zener diodes may be lower at lower temperatures. Accordingly, the clamping circuit 328 may be configured to operate reliably at the entire range of expected operating temperatures. For example, the number and type of diodes used in the clamping circuit can be selected to prevent the clamping circuit 328 from being activated at a clamping threshold voltage that is lower than turn-on voltage of the switch 302 or 304. As described above, the clamping threshold voltage will be approximately equal to the breakdown voltage of the Zener diodes 400 plus the forward biasing voltage across the set of Schottky diodes 402. By placing two Schottky diodes 402 in series, the overall voltage across the set of Schottky diodes 402 may be increased, thus increasing the clamping threshold voltage of the clamping circuit 328. In this way, the clamping circuit 328 may be tuned to provide a suitable clamping threshold voltage across the range of expected operating temperatures. Further, the clamping circuit 328 may include three, four, or more Schottky diodes depending on the desired clamping threshold voltage for a particular implementation. Further, other types of diodes with higher forward biasing voltages may be used instead of or in combination with the Schottky diodes, such as silicon diodes, and germanium diodes, among others. Additionally, although five Zener diodes 400 are shown, it will be appreciated that the clamping circuit 328 may include any suitable number of Zener diodes 400, for example, one, two, three, four, six, or more Zener diodes 400.

Figure 6:
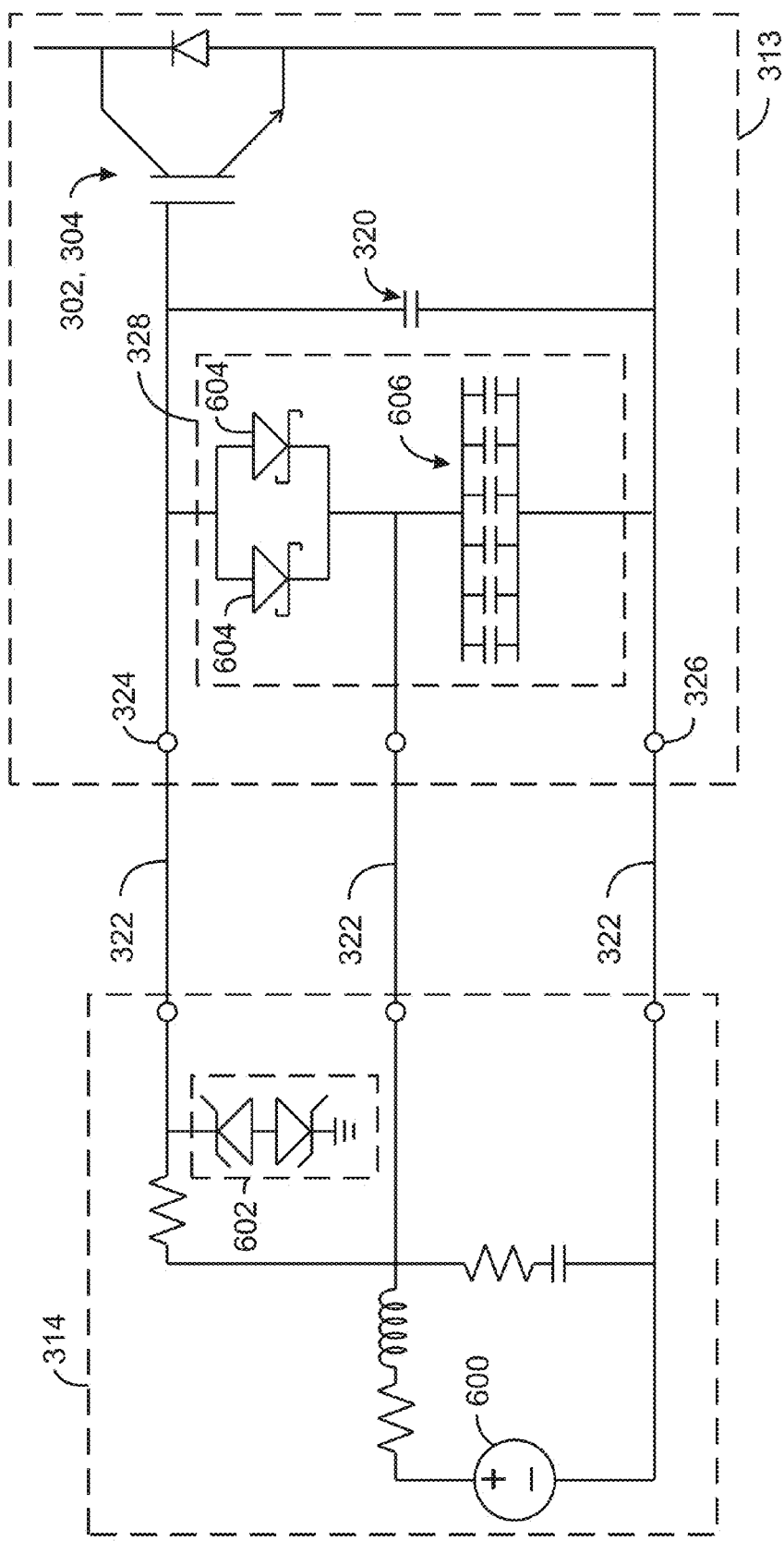
FIG. 6 is a schematic diagram of a clamping circuit in accordance with embodiments of the invention.

FIG. 6 is a schematic diagram of a clamping circuit in accordance with embodiments. As described in relation to FIG. 3, the drive circuit 314 may be disposed remotely from the switch 302 or 304 and coupled to the switch 302 or 304 through wire leads 322 that connect output terminals of the drive circuit 314 to input terminals of the switch housing 313. As before, the clamping circuit 328 may be disposed within the switch housing 313 or on the outside surface of the switch housing 313. The electrical connection between the clamping circuit 328 and the corresponding switch 302 or 304 is a low inductance connection, in the order of a few nH (e.g., less than 10 nH, or less than 5 nH, in some embodiments) for a multi kilo-ampere power switch.

The drive circuit 314 may include a voltage source 600 as well as various components configured to control the voltage levels and signal timing characteristics provided by the drive circuit 314. In an embodiment, the drive circuit 314 may include a voltage clamp 602 configured to limit the output voltage of the drive circuit 314 to a suitable level, depending on the voltage limit applicable to the switch 302 or 304. The voltage clamp 602 included in the drive circuit 314 may be electrically coupled to the gate of the switch 302 or 304 through the relatively high inductance wire leads 322, typically 10 nH/cm. Due to the wire leads 322, the effectiveness of the voltage clamp 602 included in the drive circuit 314 will be limited with respect to preventing voltage spikes across the gate and emitter of the switch 302 or 304.

As before, the clamping circuit 328 may be disposed between the gate terminal 324 and the emitter terminal 326 for the corresponding switch 302 or 304. As shown in FIG. 6, the clamping circuit 328 may include a set of diodes 604, such as Schottky diodes, disposed in series with a set of capacitors 606. The set of diodes 604 may include a single diode 604 or a plurality of diodes 604 disposed in parallel with one another. The anodes of each diode 604 are coupled to the gate terminal 324 of the switch housing 313 and the cathodes of each diode 604 are coupled to the bank of capacitors 606.

The set of capacitors 606 provides the functionality of a low pass filter. During steady state conditions, the set of capacitors 606 presents an open circuit between the gate and emitter and do not significantly affect the gate-emitter voltage. During transient conditions, such as when the switch is turned on or off, the capacitors 606 attenuate transient voltage spikes that could otherwise exceed the rated voltage limit of switch 302 or 304. Further, when the gate-emitter voltage applied to the switch is falling, the set of diodes 604 blocks the return current discharged by the capacitors 606 away from the gate. In this way, the diodes 604 prevent the capacitors 606 from interfering with the normal switch timing during turn-off. The set of capacitors may comprise one or more capacitors.

In an embodiment, the drive circuit 314 includes at least three output terminals coupled to the switch housing 313 through the wire leads 322. One wire lead 322 electrically couples the gate output terminal of the drive circuit 314 to the gate terminal 324 of the switch 302 or 304. Another wire lead 322 electrically couples the emitter output of the drive circuit 314 to the emitter terminal 326 of the switch 302 or 304. A third wire lead 322 couples the drive circuit 314 to the clamping circuit 328 and provides a return path for current that may be discharged from the set of capacitors 606. As shown in FIG. 6, the third wire lead 322 may be electrically coupled to the clamping circuit 328 at a location between the set of diodes 604 and the set of capacitors 606.

Figure 7:
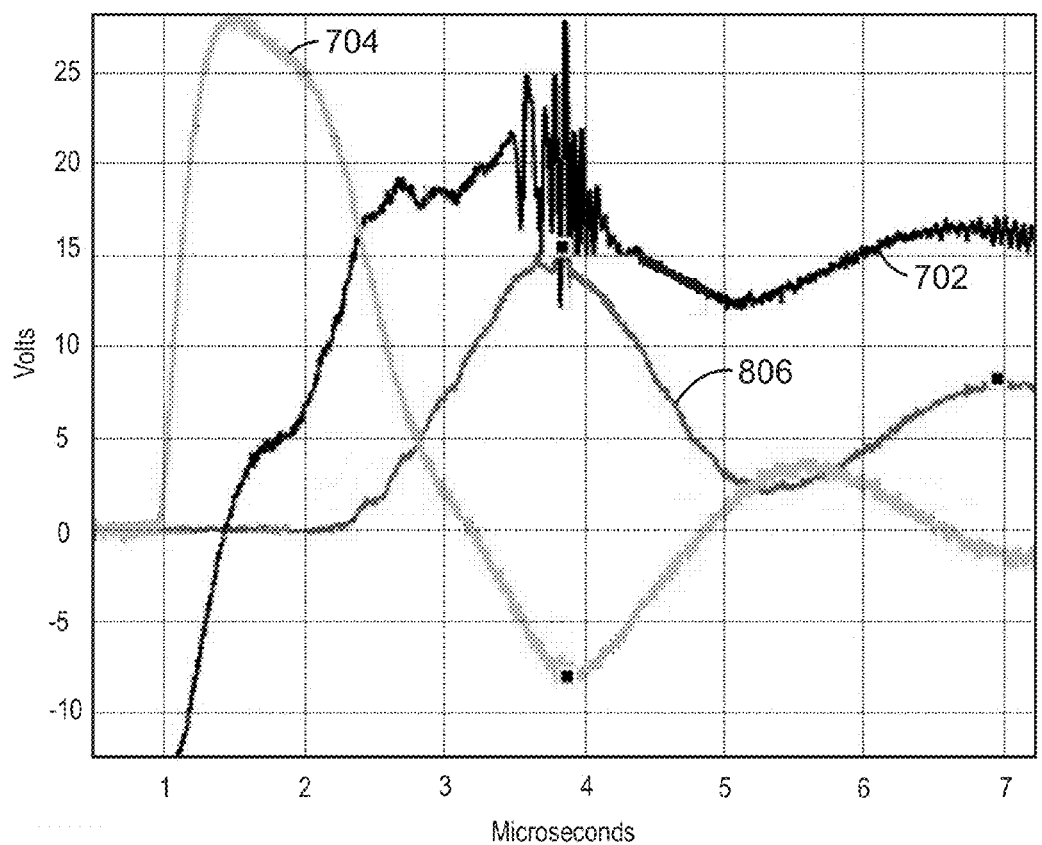
FIG. 7 is a graph of the gate-emitter voltage of an inverter module switch without the clamping circuit.

FIG. 7 is a graph of the gate-emitter voltage of an inverter module switch without the clamping circuit. Specifically, FIG. 7 shows the gate-emitter voltage of a typical inverter module switch during a fault detection event. The gate-emitter voltage is superimposed over the gate current and the collector-emitter current for the switch. The gate-emitter voltage is represented by the solid line 702, the gate current is represented by the dashed line 704, and the collector-emitter current is represented by the dotted line 706. The X-axis represents time in microseconds, and the Y-axis represents voltage with respect to the gate-emitter voltage applied to the switch, gate current and switch current suitably scaled.

The graph of FIG. 7 shows the behavior of the switch after being turned on by the drive circuit and then turned off in response to the detection of the fault condition. As shown in FIG. 7, the gate current begins to rise at approximately 1 microsecond in response to the switch being turned on by the drive circuit. Following the rise in the gate current, the gate-emitter voltage and the collector-emitter current also begin to rise. For the switch measured, the normal gate turn-on voltage should be 15 Volts and no overshoot should appear. The gate-emitter voltage continues to rise beyond the driver originated set voltage of +15V due, in part, to the inductance of the circuit, including the wire leads, and in part due to internal device physics. As shown in FIG. 7, the gate-emitter voltage experiences voltage spikes up to approximately 27 volts, which is above the specified gate-emitter voltage limit for many types of switches. Accordingly, such voltage spikes could cause damage to the switch. It should also be noted, that the drive circuit itself may include a voltage clamp, such as the voltage clamp 602 shown in FIG. 6. However, because the drive circuit is mounted remotely from the inverter module, the voltage clamp in the drive circuit has a limited effect on the gate-emitter voltage at the switch.

Figure 8:
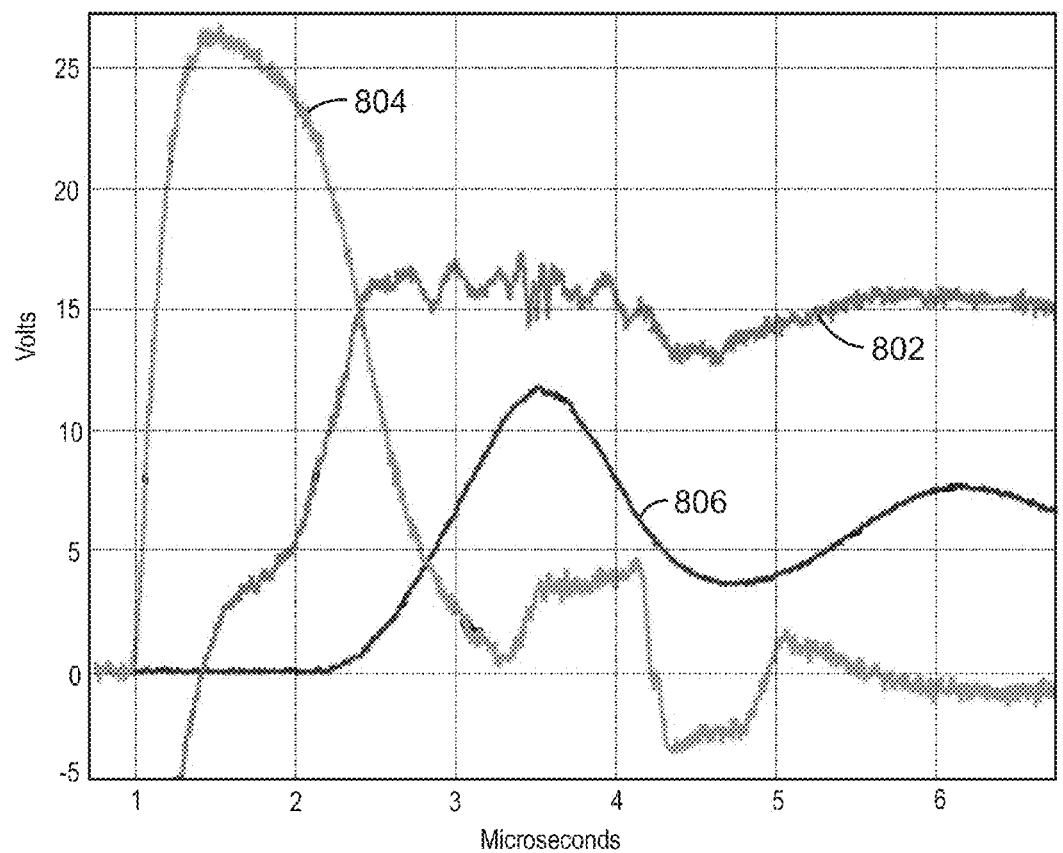
FIG. 8 is a graph of the gate-emitter voltage of an exemplary inverter module switch with the clamping circuit in accordance with embodiments of the invention.

FIG. 8 is a graph of the gate-emitter voltage of an exemplary inverter module switch with the clamping circuit in accordance with embodiments. Specifically, the graph of FIG. 8 shows the gate-emitter voltage of an inverter module switch during a fault detection event and is intended to demonstrate the effectiveness of the clamping circuit 328 as compared to a conventional power system without the clamping circuit 328. As in the graph of FIG. 7, the gate-emitter voltage is superimposed over the gate current and the collector-emitter current for the switch. The gate-emitter voltage is represented by the solid line 802, the gate current is represented by the dashed line 804, and the collector-emitter current is represented by the dotted line 806. The X-axis represents time in microseconds, and the Y-axis represents voltage with respect to the gate-emitter voltage applied to the switch, gate current and main switch current suitable scaled.

Similar to the graph of FIG. 7, the graph of FIG. 8 shows the behavior of the switch after being turned on by the drive circuit 314 and then turned off in response to the detection of a fault condition. As shown in FIG. 8, the gate current begins to rise at approximately 1 microsecond in response to the switch being turned on by the drive circuit. Following the rise in the gate current, the gate-emitter voltage and the collector-emitter current also begin to rise. The gate-emitter voltage continues to rise, but contrary to FIG. 7, when it reaches a clamping threshold voltage of approximately 17 volts, the clamping circuit 328 is activated, which limits further voltage build-up across the gate and emitter of the switch. As shown in the graph of FIG. 8, the gate-emitter voltage is successfully clamped below approximately 17 volts, and damage to the switch may be avoided. It will be appreciated that the data presented in graphs of FIGS. 7 and 8 is merely intended to demonstrate the effectiveness of the clamping circuit 328 in accordance with embodiments described herein and is not intended to be limiting.

In embodiments, the clamping circuit comprises only passive components, such as diodes and capacitors. In other embodiments, the only electronic components disposed between the output of the drive circuit and the switches 302, 304 are passive components, e.g., the clamping circuit and gate-emitter capacitor 320. In this manner, the clamping circuit provides circuit protection of the inverter as described herein without the requirement for active sensing or a control strategy.

Another embodiment relates to an inverter module. The inverter module comprises a housing and a first switch attached to the housing (e.g., the switch may be inside the housing, or mounted to the housing). The first switch is configured to be electrically coupled to a first remotely-mounted drive circuit through two or more first wire leads. The inverter module further comprises a first clamping circuit electrically coupled to terminals of the first switch and in parallel with the first switch. The first clamping circuit is disposed inside the housing or on an outer surface of the housing (separate from the drive circuit) and is configured to limit a voltage across the first switch. In embodiments, the housing may be common to all of the switches of the inverter module (i.e., the housing is an inverter module housing that houses several switches.) In other embodiments, the housing is a switch housing that contains a single switch (i.e., each switch of the inverter module is contained within a separate housing.)

In another embodiment of the inverter module, the switch comprises a transistor and the terminals comprise gate and emitter terminals connected to a gate and an emitter of the transistor, respectively.

In another embodiment of the inverter module, the inverter module further comprises a second switch in the housing, which is configured to be electrically coupled to a second remotely-mounted drive circuit through two or more second wire leads. The inverter module further comprises a second clamping circuit electrically coupled to terminals of the second switch and in parallel with the second switch. The second clamping circuit is disposed inside the housing or on an outer surface of the housing and is configured to limit a voltage across the second switch. The first and second switches are connected in series.

In another embodiment of the inverter module, each switch comprises a respective transistor and the terminals of each switch comprise gate and emitter terminals connected to a gate and an emitter of the respective transistor.

Another embodiment relates to a system comprising an inverter module as described herein, and the drive circuit, which is remotely-mounted outside and away from the housing. The terminals of the inverter module are external terminals, and the drive circuit is electrically connected to the wire leads and the wire leads are electrically and mechanically connected to the external terminals.

Another embodiment relates to an inverter module comprising a housing, first and second transistor switches attached to the housing (e.g., positioned inside the housing), and first and second clamping circuits on or within the housing. The first clamping circuit is electrically connected across gate and emitter terminals of the first transistor switch. The second clamping circuit is electrically connected across gate and emitter terminals of the second transistor switch. Each clamping circuit is configured to limit a voltage level across the gate and emitter terminals of its respective transistor switch. Each clamping circuit may comprise: a first set of diodes disposed in series with a second set of diodes; a first set of parallel-connected diodes disposed in series with a second set of diodes, the second set either parallel-connected or series-connected; a first set of Zener diodes disposed in series with a second set of diodes; a first set of parallel-connected Zener diodes disposed in series with a second set of diodes, the second set either parallel-connected or series-connected; the second set of diodes comprises Schottky diodes; and/or the first set of diodes comprises four Zener diodes disposed in parallel with each other, and the second set of diodes comprises four Schottky diodes disposed in parallel with each other. In another embodiment, each clamping circuit additionally comprises at least one capacitor connected in series with one of the sets of diodes. In another embodiment, each clamping circuit comprises at least one capacitor connected in series with a set of parallel-connected diodes. In another embodiment, each clamping circuit only includes passive components such as diodes and capacitors.

Another embodiment relates to a system comprising the inverter module described immediately above, and first and second drive circuits. The first and second drive circuits are remotely mounted from the inverter module, e.g., positioned outside the housing and away from the housing. The first transistor switch is electrically coupled to the first drive circuit through two or more first wire leads. The second transistor switch is electrically coupled to the second drive circuit through two or more second wire leads.

In another embodiment, the inverter module further includes a respective diode connected across the collector and emitter terminals of each transistor, in a reverse bias (anti-parallel) orientation of the diode.

Although embodiments are described herein with respect to transistor devices having gates, other embodiments may be applicable to transistors generally. Thus, unless otherwise specified (such as in the claims), references herein to a "gate terminal" are also applicable to controlling terminals (e.g., gate, base) of three-terminal semiconductor devices generally. In one embodiment, however, the switches of the inverter module comprise IGBTs or other gate-driven devices, which may have advantageously fast switching times and/or electrical properties.

Another embodiment relates to an inverter module comprising a transistor switch electrically coupleable to a remotely-mounted drive circuit through two or more first wire leads. The inverter module further comprises a clamping circuit electrically coupled to first and second terminals of the transistor switch and configured to limit a voltage across the first and second terminals of the transistor switch. The clamping circuit comprises a first set of parallel-connected diodes connected to one of the first terminal or the second terminal. The clamping circuit additionally comprises: at least one capacitor connected in series with the first set and connected to the other of the first terminal of the second terminal; or a second set of diodes connected in series with the first set and connected to the other of the first terminal or the second terminal (The sets of diodes may be otherwise configured as described elsewhere herein.)

Another embodiment relates to a method. The method comprises mounting an inverter module to a vehicle. The method further comprises electrically coupling a first terminal of a drive circuit to a gate terminal of the inverter module and electrically coupling a second terminal of the drive circuit to an emitter terminal of the inverter module. The emitter and gate terminals are electrically connected to a transistor switch of the inverter module. The method further comprises mounting the drive circuit to the vehicle remotely from the transistor switch of the inverter module. The inverter module includes a clamping circuit disposed on or within a housing of the transistor switch between the gate and emitter terminals for limiting a voltage between the gate and emitter terminals.

In another embodiment of the method, the clamping circuit comprises a first set of diodes coupled to the gate terminal or the emitter terminal and at least one capacitor coupled to the other of the gate terminal or the emitter terminal. The at least one capacitor and set of diodes are connected in series. The method further comprises electrically coupling a third wire lead from a third terminal of the drive circuit to the clamping circuit. The third wire lead is configured to provide a return path for current from the at least one capacitor.

In another embodiment of the method, the clamping circuit comprises a first set of diodes in series with a second set of diodes. The first set of diodes comprises Zener diodes.

In another embodiment of the method, the first set of diodes comprises four Zener diodes disposed in parallel with each other, and the second set of diodes comprises four Schottky diodes disposed in parallel with each other.

In another embodiment of the method, the clamping circuit comprises a capacitor disposed in parallel with the first set of diodes and the second set of diodes.

In another embodiment of the method, the first set of diodes comprises a plurality of Zener diodes disposed in parallel with each other, and the second set of diodes comprises a plurality of diodes disposed in series with each other.

In an embodiment, a clamping circuit comprises a first set of diodes disposed in series with a second set of diodes. The first set of diodes comprises Zener diodes, specifically, a plurality of Zener diodes disposed in parallel with each other. The second set of diodes comprises a plurality of diodes disposed in series with each other. The diodes of the second set (which may be referred to as the second diodes of the second set) are different from the diodes of the first set, and are not part of the first set.

Another embodiment relates to a power unit, e.g., an inverter module. The power unit comprises a solid-state switch having a control terminal and first and second power terminals, and a drive circuit remotely connected to the control terminal for controllably activating the switch. (Control terminal refers to a terminal to which a voltage can be applied for controlling a voltage across the power terminals; if the switch is a transistor, the control terminal may be a gate or base terminal, and the power terminals may be controller and emitter terminals or drain and source terminals, for example.) The power unit further comprises a clamping circuit electrically coupled between the control terminal and one of the first or second power terminals. The clamping circuit is configured to limit a voltage across the control terminal and the power terminal (to which the clamping circuit is coupled) to a voltage level that is above a turn-on voltage of the switch and below a maximum voltage (voltage at which damage occurs) of the switch.

In another embodiment of the power unit, the switch is disposed in a housing and the clamping circuit is disposed inside the housing or on an outer surface of the housing.

In another embodiment of the power unit, the drive circuit is remotely connected to the control terminal by a wire.

In another embodiment of the power unit, the drive circuit is remotely connected to the clamping circuit.

In another embodiment of the power unit, an inductance of an electrical connection between the clamping circuit and the control terminal is no more than 10 nH.

In another embodiment of the power unit, the switch is a transistor, the control terminal is a gate terminal of the transistor, and the power terminal (to which the clamping circuit is coupled) is an emitter terminal of the transistor. The clamping circuit comprises a Zener diode connected in series with a Schottky diode. A cathode of the Zener diode is electrically coupled to the gate terminal, an anode of the Zener diode is electrically coupled an anode of the Schottky diode, and a cathode of the Schottky diode is electrically coupled to the emitter terminal of the transistor.

Another embodiment relates to a method. The method comprises applying a first voltage signal to a control terminal of a first transistor of an inverter module to generate an alternating-current output waveform. Upon the first transistor transitioning from an on-state to an off-state, a voltage between the control terminal and a power terminal of the first transistor is limited to less than a voltage that would damage the first transistor. The voltage between the control terminal and the power terminal of the first transistor is limited by a first clamping circuit electrically connected between the control terminal and the power terminal of the first transistor. (For limiting the voltage in this manner, the clamping circuit may include Zener diodes.) The method further comprises blocking current through the first clamping circuit when the first transistor is negatively biased between the control terminal and the power terminal above a first threshold. (For blocking current in this manner, the clamping circuit may include Schottky diodes, e.g., connected in series with the Zener diodes.)

In another embodiment of the method, the first voltage signal is applied by a drive circuit remotely connected to the control terminal and first clamping circuit.

In another embodiment of the method, the method further comprises applying a second voltage signal to a control terminal of a second transistor of the inverter module to generate the alternating-current output waveform. Upon the second transistor transitioning from an on-state to an off-state, a voltage between the control terminal and a power terminal of the second transistor is limited to less than a voltage that would damage the second transistor. The voltage between the control terminal and the power terminal of the second transistor is limited by a second clamping circuit electrically connected between the control terminal and the power terminal of the second transistor. The method further comprises blocking current through the second clamping circuit when the second transistor is negatively biased between the control terminal and the power terminal of the second transistor above a second threshold.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. While the dimensions and types of materials described herein are intended to illustrate embodiments of the invention, they are by no means limiting and are exemplary in nature. Other embodiments may be apparent upon reviewing the above description. The scope of the invention should, therefore, be determined with reference to the appended claims, along with the full scope of equivalents to which such claims are entitled.

In the appended claims, the terms "including" and "in which" are used as the plain-English equivalents of the respective terms "comprising" and "wherein." Moreover, in the following claims, the terms "first," "second," "3$^{rd}$," "upper," "lower," "bottom," "top," "up," "down," etc. are used merely as labels, and are not intended to impose numerical or positional requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

As used herein, an element or step recited in the singular and proceeded with the word "a" or "an" should be understood as not excluding plural of said elements or steps, unless such exclusion is explicitly stated. Furthermore, references to "one embodiment" of the invention are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property.

Since certain changes may be made in the above-described embodiments, without departing from the spirit and scope of the invention herein involved, it is intended that all of the subject matter of the above description or shown in the accompanying drawings shall be interpreted merely as examples illustrating the inventive concept herein and shall not be construed as limiting the invention.

The invention claimed is:

1. A power unit comprising:
   a housing;
   a first switch attached to the housing and configured to be electrically coupled to a first remotely-mounted drive circuit through two or more first wire leads; and
   a first clamping circuit electrically coupled to terminals of the first switch and in parallel with the first switch, wherein the first clamping circuit is disposed inside the housing or on an outer surface of the housing and is configured to limit a voltage across the first switch.

2. The power unit of claim 1, wherein the first switch comprises a transistor and the terminals comprise gate and emitter terminals connected to a gate and an emitter of the transistor, respectively.

3. The power unit of claim 1, further comprising a second switch in the housing and configured to be electrically coupled to a second remotely-mounted drive circuit through two or more second wire leads, and a second clamping circuit electrically coupled to terminals of the second switch and in parallel with the second switch, wherein the second clamping circuit is disposed inside the housing or on an outer surface of the housing and is configured to limit a voltage across the second switch, wherein the first and second switches are connected in series.

4. The power unit of claim 1, further comprising a second switch in a second housing and configured to be electrically coupled to a second remotely-mounted drive circuit through two or more second wire leads, and a second clamping circuit electrically coupled to terminals of the second switch and in parallel with the second switch, wherein the second clamping circuit is disposed inside the second housing or on an outer surface of the second housing and is configured to limit a voltage across the second switch, wherein the first and second switches are connected in series.

5. The power unit of claim 1, wherein each switch comprises a respective transistor and the terminals of each switch comprise gate and emitter terminals connected to a gate and an emitter of the respective transistor.

6. The power unit of claim 1, wherein the clamping circuit comprises a first set of diodes disposed in series with a second set of diodes, the first set of diodes comprising Zener diodes.

7. The power unit of claim 6, wherein the second set of diodes comprises Schottky diodes.

8. The power unit of claim 6, wherein the first set of diodes comprises four Zener diodes disposed in parallel with each other, and the second set of diodes comprises four Schottky diodes disposed in parallel with each other.

9. The power unit of claim 6, wherein the clamping circuit comprises a capacitor disposed in parallel with the first set of diodes and the second set of diodes.

10. The power unit of claim 6, wherein the first set of diodes comprises a plurality of Zener diodes disposed in parallel with each other, and the second set of diodes comprises a plurality of diodes disposed in series with each other.

11. The power unit of claim 1, wherein the clamping circuit comprises a first set of diodes electrically coupled to the gate terminal, the first set of diodes disposed in series with a set of capacitors electrically coupled to the emitter terminal.

12. The power unit of claim 11, wherein a third wire lead couples a third terminal of the drive circuit to the clamping circuit, wherein the third wire lead is configured to provide a return path for current through the capacitors.

13. A system comprising:
    the power unit of claim 1; and
    the drive circuit, wherein the drive circuit is remotely-mounted outside and away from the housing, wherein the terminals are external terminals, and the drive circuit is electrically connected to the wire leads and the wire leads are electrically and mechanically connected to the external terminals.

14. A power unit, comprising:
    a solid-state switch having a control terminal and first and second power terminals;
    a drive circuit remotely connected to the control terminal for controllably activating the switch; and
    a clamping circuit electrically coupled between the control terminal and one of the first or second power terminals, wherein the clamping circuit is configured to limit a voltage across the control terminal and said one of the first or second power terminals to a voltage level that is above a turn-on voltage of the switch and below a maximum voltage of the switch.

15. The power unit of claim 14, wherein the switch is disposed in a housing and the clamping circuit is disposed inside the housing or on an outer surface of the housing.

16. The power unit of claim 14, wherein the drive circuit is remotely connected to the control terminal by a wire.

17. The power unit of claim 14, wherein the drive circuit is remotely connected to the clamping circuit.

18. The power unit of claim 14, wherein an inductance of an electrical connection between the clamping circuit and the control terminal is no more than 10 nH.

19. The power unit of claim 14, wherein:
    the switch is a transistor, the control terminal is a gate terminal of the transistor, and said one of the first or second power terminals is an emitter terminal of the transistor;
    the clamping circuit comprises a Zener diode connected in series with a Schottky diode; and
    a cathode of the Zener diode is electrically coupled to the gate terminal, an anode of the Zener diode is electrically coupled an anode of the Schottky diode, and a cathode of the Schottky diode is electrically coupled to the emitter terminal of the transistor.

20. The power unit of claim 14, wherein:
    the switch is a transistor, the control terminal is a gate terminal of the transistor, and said one of the first or second power terminals is an emitter terminal of the transistor;
    the clamping circuit comprises a Schottky diode connected in series with a capacitor; and
    an anode of the Schottky diode is electrically coupled to the gate terminal, a cathode of the Schottky diode is electrically coupled to a first terminal of the capacitor, and a second terminal of the capacitor is electrically coupled to the emitter terminal.

21. A power system, comprising:
    an inverter module controllable to generate an alternating-current output waveform for driving a motor, the inverter module comprising a clamping circuit and a transistor switch contained within a switch housing; and
    a drive circuit operatively coupled to the transistor switch through a first wire lead coupling a first terminal of the drive circuit to a gate terminal of the transistor switch and a second wire lead coupling a second terminal of the drive circuit to an emitter terminal of the transistor switch;
    wherein the clamping circuit is disposed in parallel with the transistor switch between the gate terminal and the emitter terminal for limiting a voltage across the gate and emitter terminals, and wherein the clamping circuit is disposed inside the switch housing or on an outer surface of the switch housing.

22. The power system of claim 21, wherein the clamping circuit comprises a first set of diodes disposed in series with a second set of diodes, the first set of diodes comprising Zener diodes.

23. The power system of claim 22, wherein the second set of diodes comprises Schottky diodes.

24. The power system of claim 22, wherein the first set of diodes comprises four Zener diodes disposed in parallel with each other, and the second set of diodes comprises four Schottky diodes disposed in parallel with each other.

25. The power unit of claim 22, wherein the clamping circuit comprises a capacitor disposed in parallel with the first set of diodes and the second set of diodes.

26. The power system of claim 22, wherein the first set of diodes comprises a plurality of Zener diodes disposed in parallel with each other, and the second set of diodes comprises a plurality of diodes disposed in series with each other.

27. The power system of claim 21, wherein the clamping circuit comprises a first set of diodes electrically coupled to the gate terminal, the first set of diodes disposed in series with a set of capacitors electrically coupled to the emitter terminal.

28. The power system of claim 27, wherein a third wire lead couples a third terminal of the drive circuit to the clamping circuit, wherein the third wire lead is configured to provide a return path for current from the set of capacitors.

29. The power system of claim 21, wherein the drive circuit is remotely mounted from the inverter module.

30. A mobile asset comprising the power system as defined in claim 21.

31. A power unit comprising:
- a transistor switch electrically coupleable to a remotely-mounted drive circuit through two or more first wire leads; and
- a clamping circuit electrically coupled to first and second terminals of the transistor switch and configured to limit a voltage across the first and second terminals of the transistor switch, wherein the clamping circuit comprises:
  - a first set of parallel-connected diodes connected to one of the first terminal or the second terminal; and one of:
  - at least one capacitor connected in series with the first set and connected to the other of the first terminal of the second terminal; or
  - a second set of diodes connected in series with the first set and connected to the other of the first terminal or the second terminal.

32. A method comprising:
- applying a first voltage signal to a control terminal of a first transistor of an inverter module to generate an alternating-current output waveform;
- upon the first transistor transitioning from an on-state to an off-state, limiting a voltage between the control terminal and a power terminal of the first transistor to less than a voltage that would damage the first transistor, wherein the voltage between the control terminal and the power terminal of the first transistor is limited by a first clamping circuit electrically connected between the control terminal and the power terminal of the first transistor; and
- blocking current through the first clamping circuit when the first transistor is negatively biased between the control terminal and the power terminal above a first threshold,
- wherein the first voltage signal is applied by a drive circuit remotely connected to the control terminal and first clamping circuit.

33. The method of claim 32, further comprising:
- applying a second voltage signal to a control terminal of a second transistor of the inverter module to generate the alternating-current output waveform;
- upon the second transistor transitioning from an on-state to an off-state, limiting a voltage between the control terminal and a power terminal of the second transistor to less than a voltage that would damage the second transistor, wherein the voltage between the control terminal and the power terminal of the second transistor is limited by a second clamping circuit electrically connected between the control terminal and the power terminal of the second transistor; and
- blocking current through the second clamping circuit when the second transistor is negatively biased between the control terminal and the power terminal of the second transistor above a second threshold.

* * * * *

UNITED STATES PATENT AND TRADEMARK OFFICE
CERTIFICATE OF CORRECTION

| | | |
|---|---|---|
| PATENT NO. | : 8,767,369 B2 | Page 1 of 1 |
| APPLICATION NO. | : 13/331682 | |
| DATED | : July 1, 2014 | |
| INVENTOR(S) | : Kuttenkuler et al. | |

It is certified that error appears in the above-identified patent and that said Letters Patent is hereby corrected as shown below:

On the Title Page, in Item [75], in Column 1, Line 3, delete "Baveria" and insert -- Bavaria --, therefor.

In the Drawings

Fig. 7, Sheet 7 of 8, delete Tag "806" and insert Tag -- 706 --, therefor.

In the Specification

Column 12, Line 32, delete "terminal (The" and insert -- terminal. (The --, therefor.

In the Claims

Column 17, Line 11, in Claim 25, delete "power unit" and insert -- power system --, therefor.

Signed and Sealed this
Seventh Day of October, 2014

Michelle K. Lee
*Deputy Director of the United States Patent and Trademark Office*